(12) United States Patent
Cram (10) Patent No.: US 7,114,976 B2
(45) Date of Patent: *Oct. 3, 2006

(54) TEST SOCKET AND TEST SYSTEM FOR SEMICONDUCTOR COMPONENTS WITH EASILY REMOVABLE NEST

(75) Inventor: Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/229,169

(22) Filed: Sep. 16, 2005

(65) Prior Publication Data

US 2006/0012389 A1    Jan. 19, 2006

Related U.S. Application Data

(62) Division of application No. 10/425,202, filed on Apr. 28, 2003, now Pat. No. 6,998,862.

(51) Int. Cl.
*H01R 12/00* (2006.01)

(52) U.S. Cl. .................................. 439/330; 439/70

(58) Field of Classification Search .................. 439/70, 439/71, 73, 330, 525, 526; 324/755–765, 324/158.1
See application file for complete search history.

(56) References Cited

U.S. PATENT DOCUMENTS

| | | | |
|---|---|---|---|
| 4,637,670 A * | 1/1987 | Coller et al. ................. | 439/180 |
| 5,223,785 A | 6/1993 | Becker | |
| 5,267,395 A | 12/1993 | Jones, Jr. et al. | |
| 5,290,192 A | 3/1994 | Espenshade et al. | |
| 5,376,010 A | 12/1994 | Petersen | |
| 5,409,392 A | 4/1995 | Marks et al. | |
| 5,410,257 A | 4/1995 | Swaffield | |
| 5,414,370 A | 5/1995 | Hashinaga et al. | |
| 5,658,153 A | 8/1997 | Ikeya et al. | |
| 5,690,281 A | 11/1997 | Ikeya et al. | |
| 6,072,322 A | 6/2000 | Viswanath et al. | |
| 6,072,326 A | 6/2000 | Akram et al. | |
| 6,083,013 A | 7/2000 | Yamagishi | |
| 6,181,149 B1 | 1/2001 | Godfrey et al. | |
| 6,209,194 B1 | 4/2001 | Kang et al. | |
| 6,264,479 B1 | 7/2001 | Ozawa | |
| 6,326,688 B1 | 12/2001 | Ochiai | |
| 6,351,034 B1 | 2/2002 | Farnworth et al. | |
| 6,396,291 B1 | 5/2002 | Akram et al. | |
| 6,431,900 B1 * | 8/2002 | Yu .............................. | 439/342 |

(Continued)

*Primary Examiner*—Neil Abrams
(74) *Attorney, Agent, or Firm*—Stephen A. Gratton (57) ABSTRACT

A test socket (52) for a semiconductor component (12) includes a base (54), a movable lid (56), socket contacts (68) for electrically engaging terminal contacts (14) on the component (12), and a retention mechanism (74) having latches (74) actuated by movement of the lid (56) for inward and outward movement during retention and release of the component (12). Such lid (56) and latch (74) movement provides a loading/unloading position, in which the component (12) can be loaded or unloaded, and then a testing position, in which the component (12) is retained by the retention mechanism (74) in electrical communication with the socket contacts (68). The test socket (52) also includes a nest (58) for aligning the component (12), which is configured for removal or installation in the testing position of the test socket (52) while the latches (74) are in the inward or retention position. To permit such removal, the nest (58) includes openings (84) in a support surface (82) so that the nest (58) can be removed even though the latches (74) are inwardly positioned.

35 Claims, 8 Drawing Sheets

U.S. PATENT DOCUMENTS

| | | |
|---|---|---|
| 6,441,628 B1 | 8/2002 | Farnworth et al. |
| 6,489,673 B1 | 12/2002 | Arnold et al. |
| 6,626,682 B1 * | 9/2003 | Sausen .................. 439/70 |
| 6,741,089 B1 | 5/2004 | Conroy |
| 6,998,862 B1 * | 2/2006 | Cram .................. 324/755 |
| 2003/0016038 A1 | 1/2003 | Frankowsky |

* cited by examiner

TEST SOCKET AND TEST SYSTEM FOR SEMICONDUCTOR COMPONENTS WITH EASILY REMOVABLE NEST

CROSS REFERENCE TO RELATED APPLICATIONS

This application is a division of Ser. No. 10/425,202 filed Apr. 28, 2003, U.S. Pat. No. 6,998,862 B2.

FIELD OF THE INVENTION

This invention relates generally to semiconductor manufacture and testing. More particularly, this invention relates to a test socket for testing semiconductor components, to a method for testing semiconductor components using the test socket, and to test systems incorporating the test socket.

BACKGROUND OF THE INVENTION

Semiconductor components, such as dice and packages, are tested at the wafer level prior to being singulated into separate components, and then at the die level prior to shipment. For certifying a component as a known good die (KGD), the component must also be burn-in tested. Burn-in tests are typically performed by placing a singulated component in a test socket on a burn-in board. The burn-in board mounts to an oven in electrical communication with test circuitry. The test socket provides electrical connections for addressing the integrated circuits on the component, while the component is subjected to elevated temperatures for an extended period of time.

The test socket includes contacts for electrically engaging the terminal contacts on the component. For example, the terminal contacts on the component can comprise bumps, balls, or leads, and the socket contacts can comprise springs, pins or beams. One type of test socket includes a nest which functions to align the component in the socket, such that the socket contacts electrically engage the terminal contacts on the component.

As the industry advances, semiconductor manufacturers are developing new components having smaller peripheral outlines (footprints), and denser configurations of terminal contacts. For example, a second generation component, such as a chip scale package (CSP), typically has a smaller outline than a first generation component, such as a ball grid array (BGA) device. These differences in size require that the test sockets be modified to accommodate the later generation components. For example, the nest in a test socket can be replaced by a different nest configured to align the second generation component in the test socket. With some prior art test sockets it is difficult to replace the nest in the field without damaging or stressing other elements of the test socket, particularly the socket contacts.

Figure 1A:
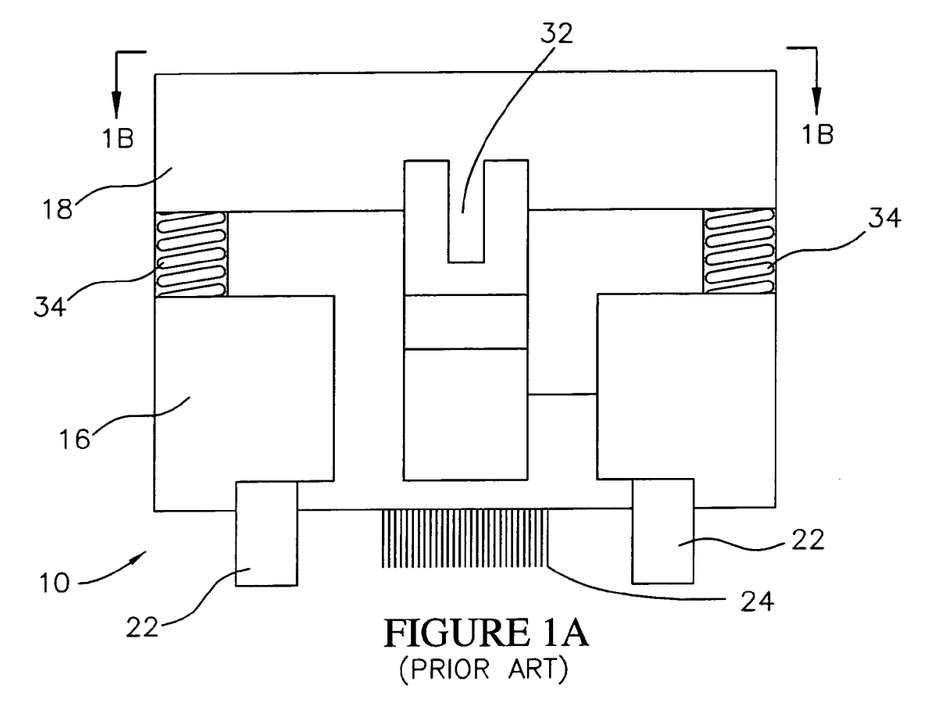
FIG. 1A is an enlarged schematic side elevation view of an unloaded prior art test socket shown in a testing position.
Figure 1B:
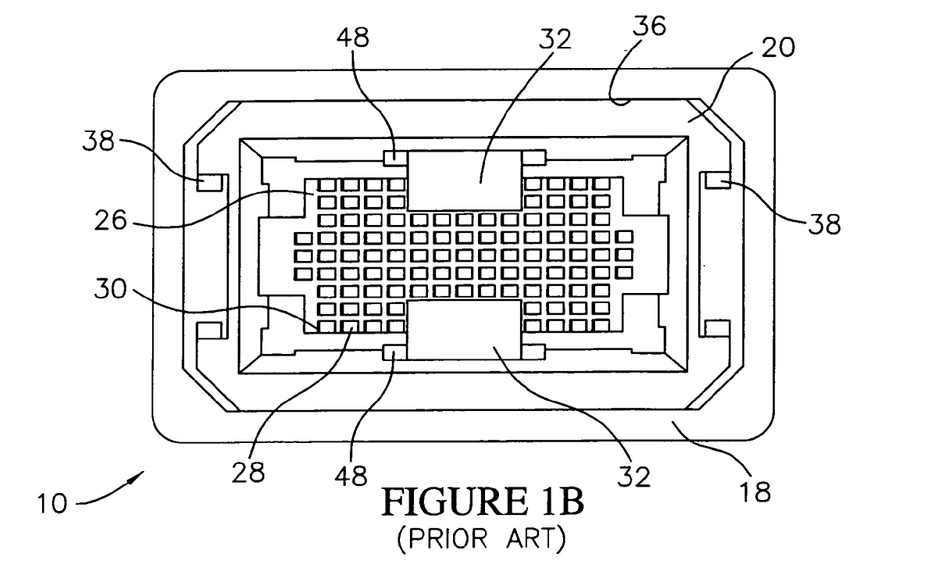
FIG. 1B is an enlarged schematic plan view of the prior art unloaded test socket in the testing position taken along section line 1B—1B of FIG. 1A.
Figure 2A:
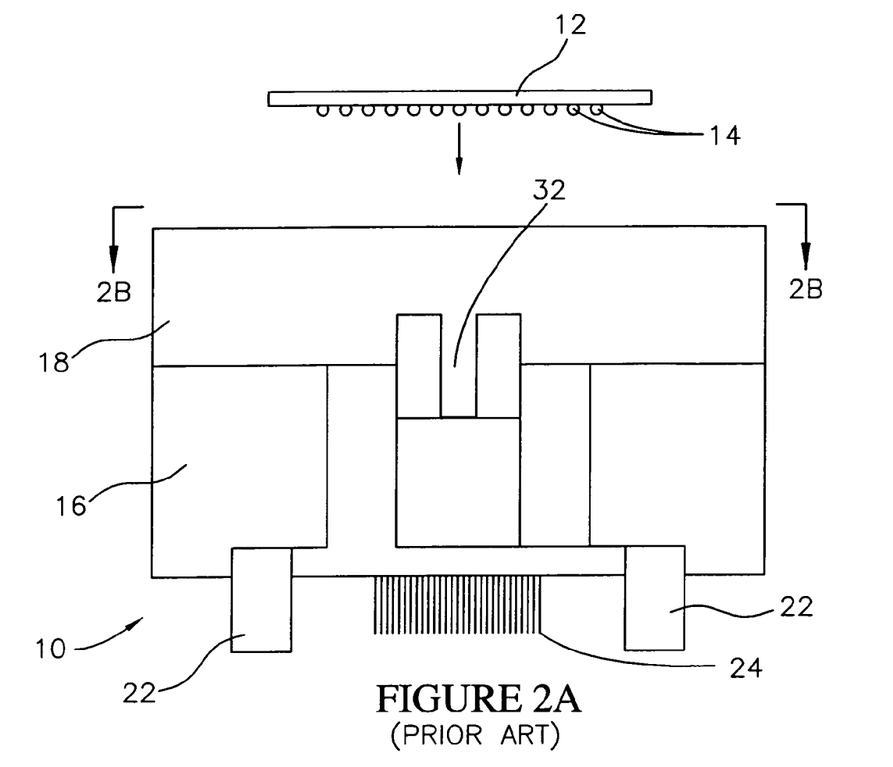
FIG. 2A is an enlarged schematic side elevation view of the prior art test socket shown in a loading/unloading position.
Figure 2B:
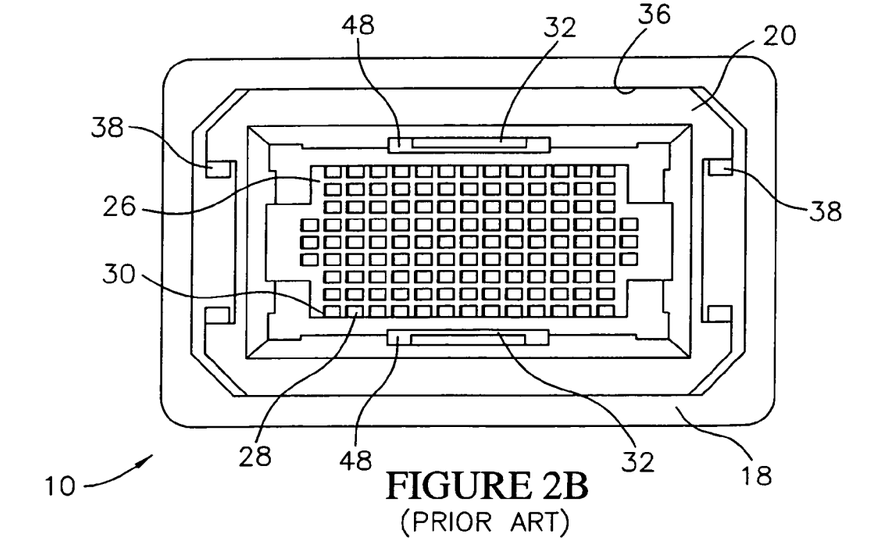
FIG. 2B is an enlarged schematic plan view of the test socket in the loading/unloading position.
Figures 3A, 3C:
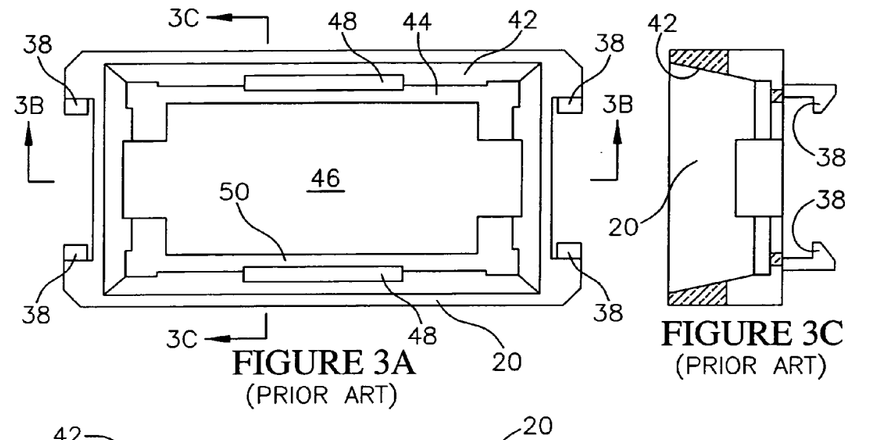
FIG. 3A is an enlarged schematic plan view of a prior art nest for the prior art test socket.
FIG. 3C is an enlarged schematic cross sectional view of the prior art nest taken along section line 3C—3C of FIG. 3A.
Figure 3B:
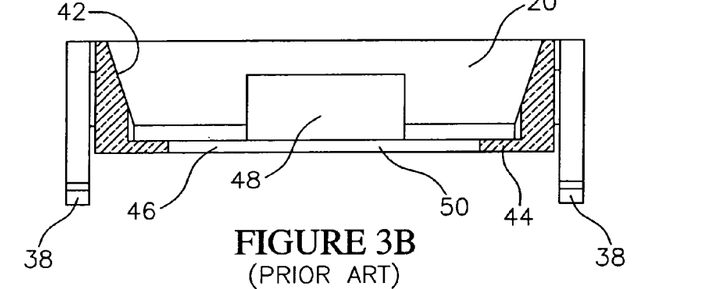
FIG. 3B is an enlarged schematic cross sectional view of the prior art nest taken along section line 3B—3B of FIG. 3A.

Referring to FIGS. 1A–1B and 2A–2B, a prior art burn-in test socket 10 configured to electrically engage a semiconductor component 12 (FIG. 2A) having a pattern of terminal contacts 14 (FIG. 2A) is illustrated. In this example the component 12 comprises a chip scale semiconductor package, and the terminal contacts 14 comprise solder bumps, or balls, in an area array (e.g., ball grid array). The test socket 10 includes a base 16 (FIGS. 1A and 2A), a movable lid 18 (FIGS. 1A–1B and 2A–B) and a nest 20 (FIGS. 1B and 2B).

The base 16 includes four cylindrical mounting pins 22 (FIGS. 1A and 2A) configured for mounting the test socket 10 to a burn-in board (not shown) having mating circular openings (not shown) for engaging the mounting pins 22.

The base 16 also includes a plurality of pin contacts 24 (FIGS. 1A and 2A) configured to electrically engage mating contacts (not shown) on the burn-in board. The base 16 also includes a contact plate 26 (FIGS. 1B and 2B) having a checker board pattern of generally rectangular openings 28 (FIGS. 1B and 2B), that correspond in size and location to the terminal contacts 14 on the component 12. In addition, selected openings 28 on the contact plate 26 include socket contacts 30 (FIGS. 2A and 2B) in electrical communication with the pin contacts 24 (FIG. 1A), which are configured to electrically engage the terminal contacts 14 on the component 12.

The lid 18 is movably mounted to the base 16, and operates a pair of retention mechanisms 32 configured to retain the component 12 on the contact plate 26. The retention mechanisms 32 comprise latches that contact the top of the component 12 proximate to opposing longitudinal edges thereof to hold the component 12 on the contact plate 26. Springs 34 (FIG. 1A) on the base 16 bias the lid 18 and the retention mechanisms 32 to a testing position shown in FIGS. 1A and 2A, in which the component 12 is retained on the contact plate 26 with the terminal contacts 14 (FIGS. 2A and 2B) in electrical communication with the socket contacts 30 (FIGS. 2A and 2B). In FIGS. 1A and 1B, the socket 10 is shown in the testing position, but without the component 12 having been loaded into the socket 10.

Compression of the lid 18 to the loading/unloading position shown in FIGS. 2A and 2B, operates the retention mechanisms 32, such that the component 12 can be loaded into the test socket 10 without interference from the retention mechanisms 32. Also in the loading/unloading position, the location of the contact plate 26 is shifted such that the terminal contacts 14 on the component 12 can enter the openings 28 on the contact plate 26 without interference from the socket contacts 30.

Referring to FIGS. 3A–3C and 4, the nest 20 is shown separately, after having been removed from the test socket 10. The nest 20 functions as an alignment member for aligning the component 12 in the test socket 10. In addition, the nest 20 can be removed from the test socket 10, and replaced by a second nest (not shown) configured to align a different component (not shown) in the test socket 10.

The nest 20 has a peripheral outline that matches the outline of a hollow interior portion 36 (FIG. 2B) of the test socket 10. In addition, the nest 20 includes clip members 38 on opposing lateral sides thereof, which mate with matching clip elements 40 (FIG. 5A) on the base 16 of the test socket 10. The clip members 38 attach the nest 20 to the base 16, but can be manipulated for removing the nest 20 from the base 16.

The nest 20 also includes a sloped alignment surface 42 for aligning the component 12, as it is inserted into the test socket 10. In addition, the nest 20 includes a support surface 44 for supporting the component 12 on the contact plate 26 (FIG. 2B) of the test socket 10. The support surface 44 includes an opening 46 therein which allows the terminal contacts 14 (FIG. 2A) on the component 12 to contact the socket contacts 30 on the base 16.

The nest 20 also includes cut out openings 48 on opposing longitudinal sides thereof, which allow the retention mechanisms 32 (FIGS. 1B and 2B) to move from the loading/unloading position of the test socket 10 (FIG. 2B) to the testing position of the test socket 10 (FIG. 1B). In the testing position of FIG. 1B, the retention mechanisms 32 extend through the openings 48 to hold the component 12 on the contact plate 26. In the loading/unloading position of FIG.

2B, the retention mechanisms 32 retract through the openings 48 to allow the component 12 to be placed on the contact plate 26.

Figure 4:
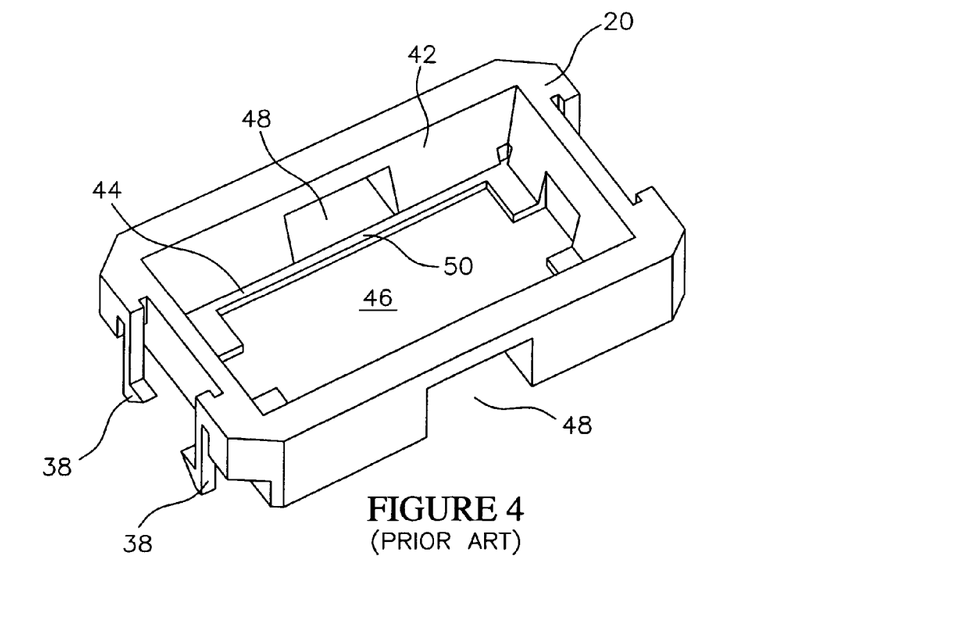
FIG. 4 is an enlarged schematic perspective view of the prior art nest.
Figure 5A:
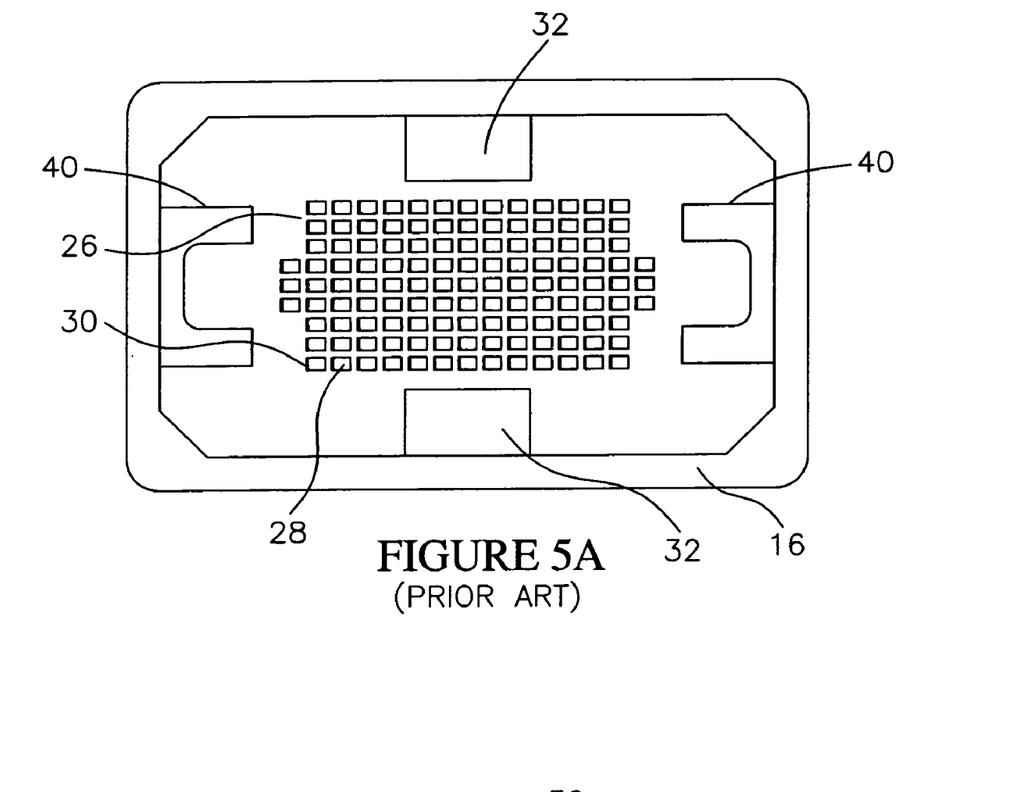
FIG. 5A is an enlarged schematic plan view of the prior art test socket in the loading/unloading position equivalent to FIG. 2B but with a nest element removed.
Figure 5B:
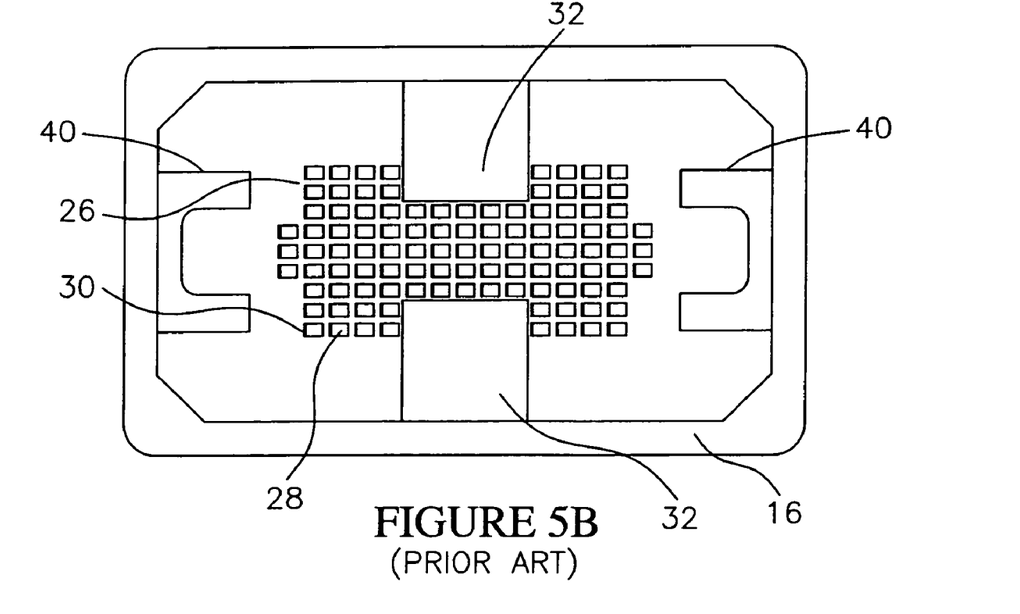
FIG. 5B is an enlarged schematic plan view of the prior art test socket in the testing position equivalent to FIG. 1B but with a nest element removed.

One aspect of the test socket 10 is that the nest 20 cannot be removed without compressing the lid 18, and shifting the test socket 10 to the loading/unloading position of FIG. 2A. FIG. 5A illustrates the base 16 of the test socket 10 in the loading/unloading position with the nest 20 removed. FIG. 5B illustrates the base 16 of the test socket 10 in the testing position with the nest 20 removed. In the testing position the retention mechanism 32 engage portions 50 (FIG. 4) of the support surface 44 of the nest, such that the nest cannot be extracted from the test socket 10.

One problem with having to shift the test socket 10 to the loading/unloading position to remove the nest 20 is that it is difficult to perform in the field with the test socket attached to a burn-in board. Although the nest 20 can be removed in the field, the test socket 10 must often be removed from the burn-in board and transferred to a bench for removing the nest 20. In addition, with the test socket 10 in the loading/unloading position the socket contacts 30 (FIG. 2B) are more susceptible to damage because they are "open" for receiving the terminal contacts 14. It would be desirable to be able to remove and service the nest 20 in the testing position of the test socket 10 (FIG. 1B).

The present invention is directed to a test socket having a nest that can be easily serviced or replaced in the field without shifting the test socket to a loading/unloading position, and without damaging other components of the test socket, such as the socket contacts. In addition, the present invention is directed to a method for testing semiconductor components using the test socket, and to test systems incorporating the test socket.

SUMMARY OF THE INVENTION

In accordance with the invention a test socket for testing semiconductor components, a method for testing semiconductor components using the test socket, and test systems incorporating the test socket are provided.

The test socket includes a base, a lid attached to the base, and a nest removably attached to the base. The base includes a contact plate with a pattern of socket contacts configured to electrically engage terminal contacts on a component. The lid is operably associated with a retention mechanism on the base configured to retain the component on the contact plate. In addition, the lid is movable from a testing position in which the retention mechanism is positioned to retain the component on the contact plate, to a loading/unloading position in which the retention mechanism is positioned to allow the component to be placed on, or removed from, the contact plate.

The nest is configured to align the component in the test socket, such that the socket contacts on the contact plate electrically engage the terminal contacts on the component. In addition, the nest includes openings and a support surface configured to allow the nest to be removed from the test socket in the testing position, without interference from the retention mechanism. Because the nest can be removed with the test socket in the testing position, damage to the socket contacts can be minimized, and the nest can be serviced or replaced in the field.

The method for testing includes the steps of providing the test socket, and testing a first component using the test socket. In addition, the method includes the step of removing the first component from the test socket, and the step of removing the nest from the test socket with the test socket in the testing position. The method also includes the steps of placing a second nest for a second component into the test socket with the test socket in the testing position, placing the second component into the test socket, and then testing the second component.

The system includes a burn-in board, and one or more test sockets mounted to the burn-in board for retaining and electrically engaging the components. The test system can also include a testing circuit in electrical communication with the burn-in board and with the test sockets on the burn-in board, and a burn-in oven configured to heat the components on the burn-in board.

DETAILED DESCRIPTION OF THE PREFERRED EMBODIMENTS

As used herein, the term "semiconductor component" refers to an electronic element that includes a semiconductor die. Exemplary semiconductor components include semiconductor packages, semiconductor dice, BGA devices, and DDC devices.

Figure 6A:
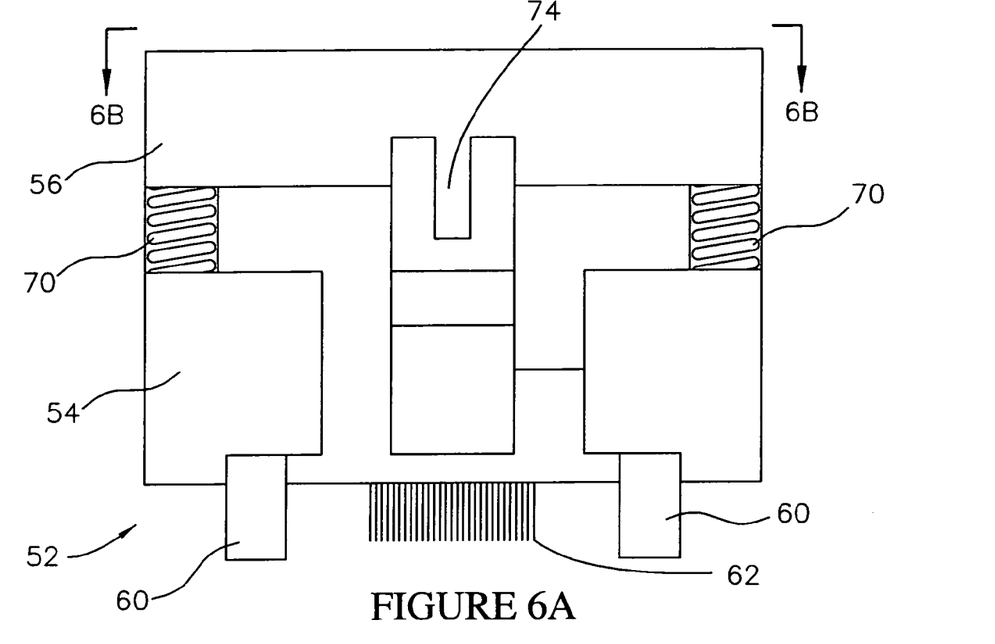
FIG. 6A is an enlarged schematic side elevation view of a test socket constructed in accordance with the invention in a testing position.
Figure 6B:
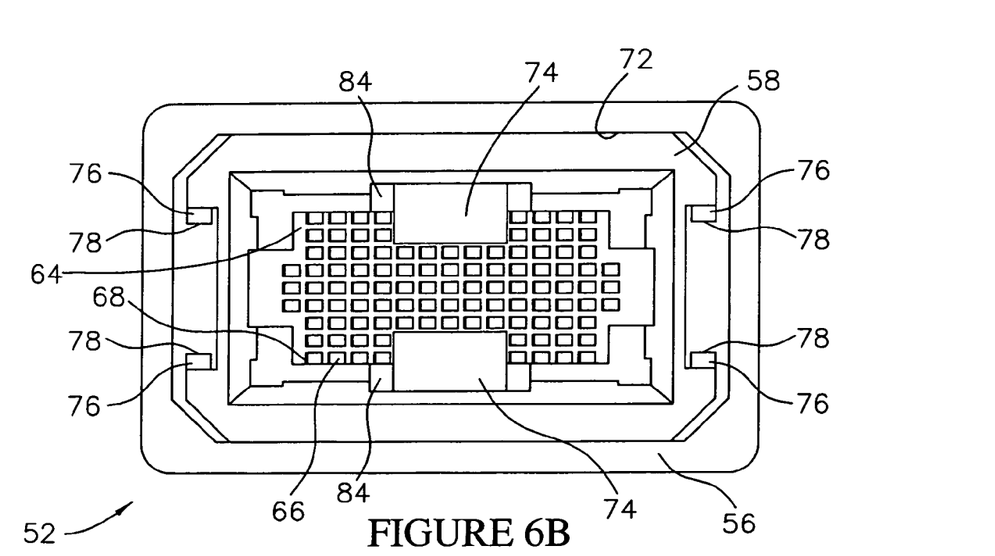
FIG. 6B is an enlarged schematic plan view of the test socket in the testing position taken along section line 6B—6B of FIG. 6A.

Referring to FIGS. 6A and 6B, a test socket 52 constructed in accordance with the invention is illustrated. The test socket 52 includes a base 54, a movable lid 56 attached to the base 54, and a nest 58 attached to the base 54. The elements of the test socket 52 can be fabricated out of rigid high temperature materials that are known in the art, such as molded plastic and metal.

Figure 10A:
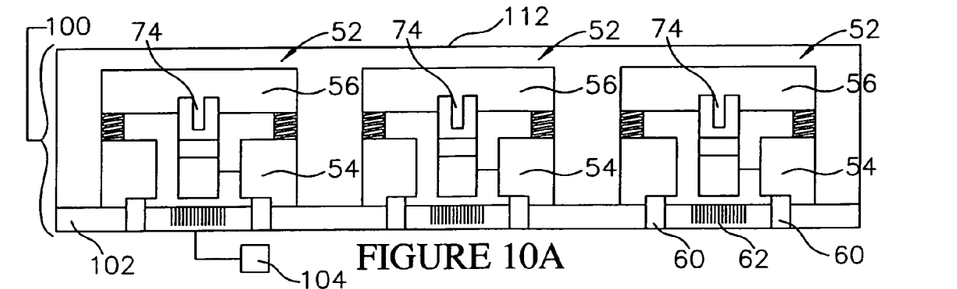
FIGS. 10A–10D are schematic cross sectional views illustrating a test system incorporating the test socket of the invention and steps in a test method performed using the test system.

The base 54 includes four cylindrical mounting pins 60 configured for mounting the test socket 52 to a burn-in board 102 (FIG. 10A) having mating circular openings for engaging the mounting pins 60. The base 54 also includes a plurality of pin contacts 24, 62 configured to electrically engage mating contacts on the burn-in board 102 (FIG. 10A) in electrical communication with a testing circuitry 104 (FIG. 10A).

Figure 7A:
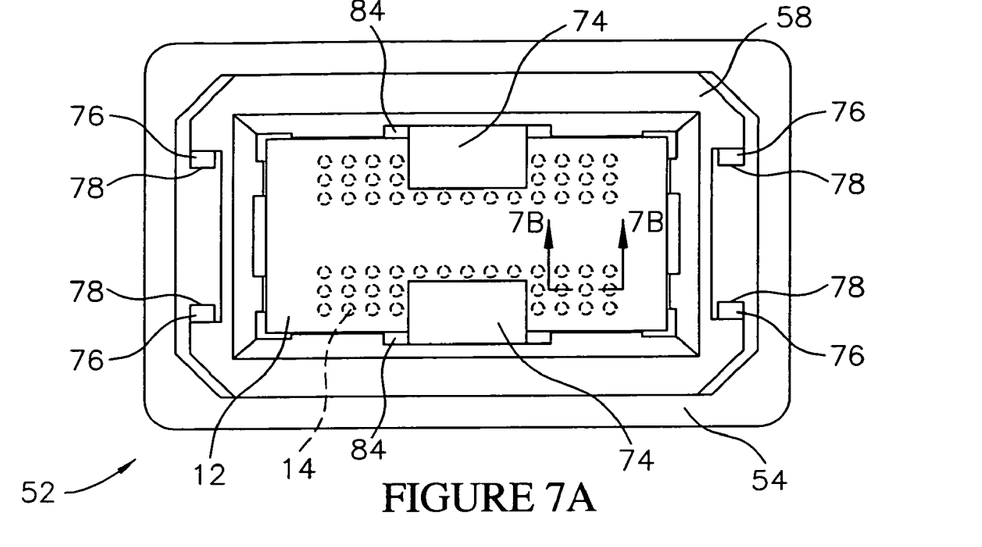
FIG. 7A is an enlarged schematic plan view of the test socket of the invention in the testing position, similar to FIG. 6B, but showing the test socket loaded with the component.

As shown in FIG. 6B, the base 54 also includes a contact plate 64 having a checker board pattern of generally rectangular openings 66, that correspond in size and location to the terminal contacts 14 (FIG. 7A) on the component 12 (FIG. 7A). The contact plate 64 is similar in construction to a screen and the openings 66 correspond to the openings in the screen. In addition, selected openings 66 on the contact plate 64 include socket contacts 68 in electrical communication with the pin contacts 62, which are configured to electrically engage the terminal contacts 14 (FIG. 7A) on the component 12 (FIG. 7A). With the base 54 mounted to the burn-in board 102 (FIG. 10A) the pin contacts 62 and the socket contacts 68 are in electrical communication with the testing circuitry 104 (FIG. 10A).

The lid 56 is movably mounted to the base 54, and operates a pair of retention mechanisms 74 configured to retain the component 12 on the contact plate 64. In addition, the lid 56, and the base 54 as well, have a hollow interior portion 72 which allow the nest 58 and the component 12 to be inserted therein. As shown in FIG. 7A, the retention mechanisms 74 comprise a pair of clasps that contact the top surface of the component 12 proximate to opposing longitudinal edges thereof, to hold the component 12 on the contact plate 64. Alternately, the retention mechanisms 74 can comprise bails, latches or any other retention mechanism used in the art.

Springs 70 (FIG. 6A) on the base 54 bias the lid 56 and the retention mechanisms 74 to the testing position shown in FIGS. 6A and 6B, in which the component 12 is retained on the contact plate 64 with the terminal contacts 14 in electrical communication with the socket contacts 68. In FIGS. 6A and 6B, the socket 52 is shown in the testing position, but without the component 12 having been loaded into the socket 52.

Figure 7B:
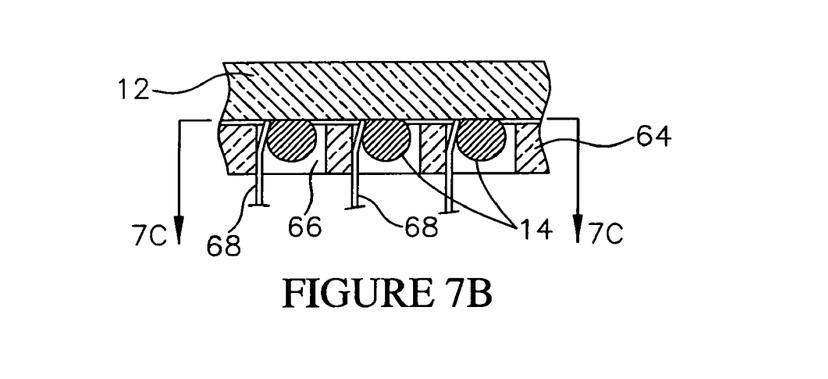
FIG. 7B is an enlarged schematic cross sectional view taken along section line 7B—7B of FIG. 7A illustrating terminal contacts on the component engaging socket contacts on the test socket of the invention in the testing position.
Figure 7C:
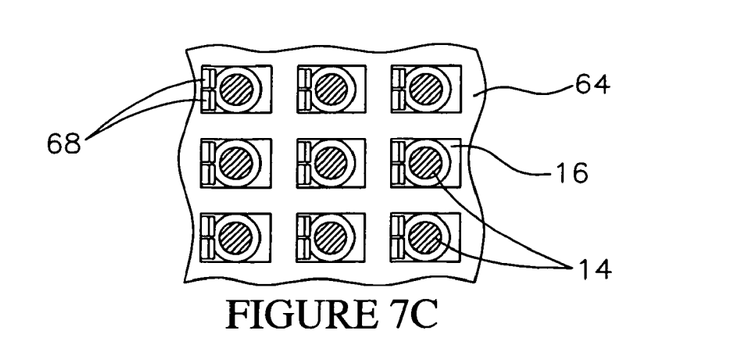
FIG. 7C is an enlarged schematic cross sectional view taken along section line 7C—7C of FIG. 7B illustrating the terminal contacts engaging the socket contacts in the testing position.
Figures 8A, 8C:
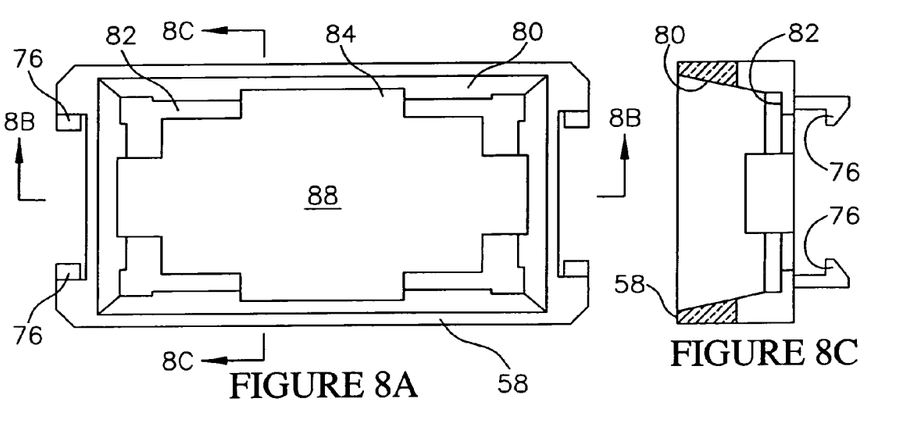
FIG. 8A is an enlarged schematic plan view of a nest element of the test socket of the invention.
FIG. 8C is an enlarged schematic cross sectional view of the nest taken along section line 8C—8C of FIG. 8A.
Figure 8B:
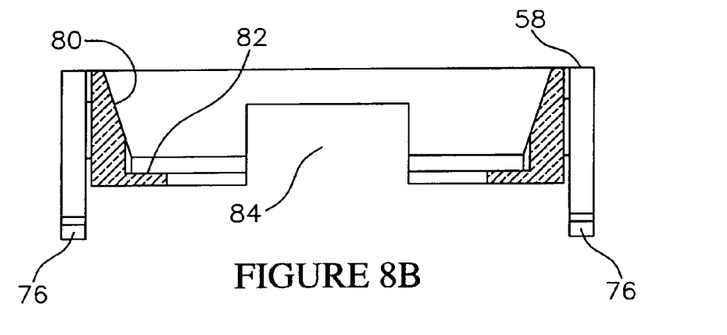
FIG. 8B is an enlarged schematic cross sectional view of the nest taken along section line 8B—8B of FIG. 8A.
Figure 9:
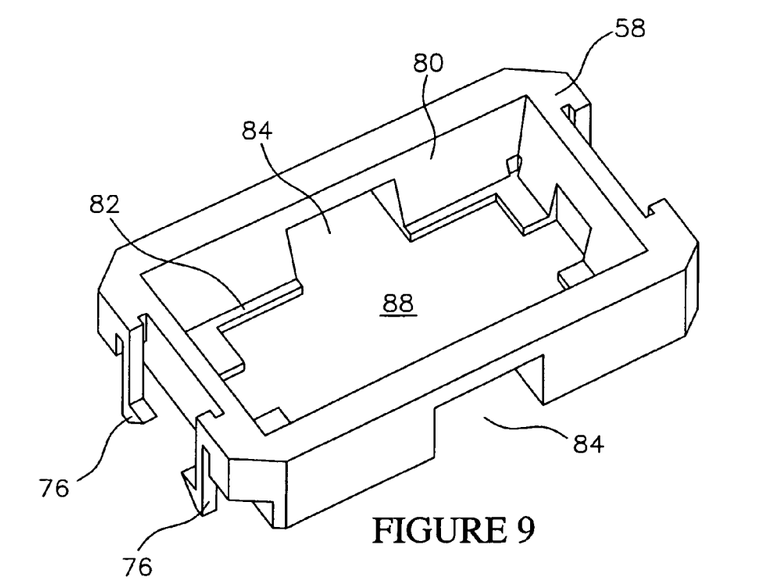
FIG. 9 is an enlarged schematic perspective view of the nest.

In FIG. 7A, the socket 52 is shown in the testing position with the component 12 retained on the contact plate 64 by the retention mechanisms 74. As shown in FIGS. 7B and 7C, with the socket 52 in the testing position, the socket contacts 68 electrically engage the terminal contacts 14 on the component 12. In addition, the openings 66 in the contact plate 64 function as a fine alignment mechanism for aligning the terminal contacts 14 to the socket contacts 68.

Compression of the lid 56 to the loading/unloading position operates the retention mechanisms 74, such that the component 12 can be loaded into the test socket 52 without interference from the retention mechanisms 74, substantially as previously described for the test socket 10 (FIGS. 2A and 2B). Also in the loading/unloading position, the location of the contact plate 64 is shifted such that the terminal contacts 14 on the component 12 can enter the openings 66 on the contact plate 64 without substantial interference from the socket contacts 68. This type of test socket 52 is sometimes referred to as a zero insertion force (ZIF) socket, because no forces are exerted on the terminal contacts 14 during insertion of the component 12 into the test socket 52.

Referring to FIGS. 8A–8C and 9, the nest 58 for the test socket 52 is shown separately. The nest 58 is similar in construction to the prior art nest 20 (FIG. 4). However, the nest 58 differs from the previously described nest 20 (FIG. 4) in that it is designed to be removed and inserted with the test socket 52 in the testing position (FIG. 6A).

The nest 58 comprises a molded plastic member having a peripheral outline that matches the outline of the hollow interior portion 72 (FIG. 6B) of the test socket 52. In addition, the nest 58 includes clip members 76 on opposing lateral sides thereof, which mate with matching clip elements 78 (FIG. 6B) on the base 54 of the test socket 52. The clip members 76 attach the nest 58 to the base 54 of the test socket 52, but can be manipulated for removing the nest 58 from the base 54.

The nest 58 also includes an alignment opening 80 having sloped alignment surfaces for aligning the component 12, as it is inserted into the test socket 52. The alignment opening 80 can have a peripheral outline which substantially matches the peripheral outline of the component 12, but with the alignment surfaces tapered from a larger to a smaller peripheral outline. In addition, the nest 58 includes a support surface 82 for supporting the component 12 on the contact plate 64 (FIG. 6B) of the test socket 52. The support surface 82 has a generally rectangular picture frame shape with a generally rectangular opening 88. The support surface 82 supports the outside periphery of the component 12, while the opening 88 allows the terminal contacts 14 (FIG. 2A) on the component 12 to contact the socket contacts 68 on the base 54 of the test socket 52. The support surface 82 is shaped to support the component 12 during electrical engagement of the terminal contacts 14 by the socket contacts 68 but to allow removal or installation of the nest 58 from the base 54 without interference from the retention mechanisms 74.

In addition, the support surface 82 is configured to not contact the retention mechanisms 74 in either position of the test socket 52, such that the nest 58 can be removed from the test socket 52 with the test socket 52 in the testing position of FIG. 7A. This allows the nest 58 to be removed in the field, (e.g., at the test site), without having to remove the test socket 52 from the burn-in board 102 (FIG. 10A). In addition, with the test socket 52 in the testing position, the socket contacts 68 (FIG. 7C) are not as easily damaged during removal of the nest 58 from the test socket 52. Because the nest 58 can be more easily removed, serviced and replaced it is termed herein as a "serviceable nest".

The nest 58 also includes cut out openings 84 on opposing longitudinal sides thereof, which are located in the in the support surface 82, and in the alignment surface of the alignment opening 80. The cut out openings 84 allow the retention mechanisms 74 (FIG. 7A) to, move from the testing position of the test socket 52 (FIG. 6A) to the loading/unloading position of the test socket 52 without interference from the nest 58. In the testing position of FIG. 7A, the retention mechanisms 74 extend through the openings 84 to hold the component 12 on the contact plate 64 on the base 54. In the loading/unloading position of the test socket 52, the retention mechanisms 74 retract through the openings 84 to allow the component 12 to be placed on the contact plate 64 on the base 54. As the cut out openings 84 extend through the support surface 82, there is no segment of the support surface 82 proximate to the retention mechanisms 74. This allows the nest 58 to be inserted into, and also removed from the test socket 52, without interference from the retention mechanisms 74.

Referring to FIGS. 10A–10D, a test method using the test socket 52, and a test system 100 incorporating the test socket 52 are illustrated. As shown in FIG. 10A, the test system 100 includes a burn-in board 102, a burn-in oven 112 and a testing circuitry 104 in electrical communication with the burn-in board.

The burn-in board 102 is adapted to retain a plurality of test sockets 52 in the burn-in oven 112 in electrical communication with the testing circuitry 104. The burn-in board 102 includes openings for engaging the mounting pins 60 on the test sockets 52. In addition, the burn-in board 102 includes electrical receptacles in electrical communication with the testing circuitry 104 for electrically engaging the pin contacts 62 on the test sockets 52.

The testing circuitry 104 is adapted to generate and apply test signals to the integrated circuits on the components 12, or to simply apply a biasing voltage to the integrated circuits on the component 12. The burn-in oven 112 is adapted to heat the burn-in board 102, the test sockets 52 and the components 12 therein, to an elevated temperature, for an extended period of time, in order to perform burn-in testing of the components 12. As used herein, the term "burn-in testing" means the process of electrically stressing the components 12 at an elevated temperature and voltage environment, for a period of time sufficient to cause failure of marginal components 12.

Initially, the components 12 (first components in the claims) can be loaded into the test sockets 52 using automated or manual equipment and techniques that are known in the art. As shown in FIG. 10A, the components 12 are burn-in tested with the test sockets 52 on the burn-in board 102 in the testing position. In the testing position the components 12 are retained by the retention mechanisms 74, substantially as shown in FIGS. 7A–7C, with the terminal contacts 14 on the components 12 in electrical communication with the socket contacts 68 on the test sockets 52, and with the testing circuitry 104 in electrical communication with the socket contacts 68.

Figure 10B:
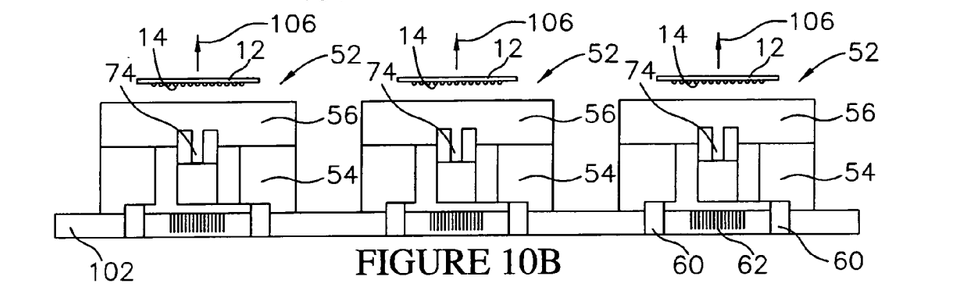

Next, as shown in FIG. 10B, following burn-in testing of the components 12, the burn-in board 102 can be removed from the burn-in oven 112, and the tested components 12 removed from the test sockets 52, as indicated by component removal arrows 106. However, prior to removing the components 12, the test sockets 52 must be shifted from the testing position to the loading/unloading position. The test sockets 52 can be placed in the loading/unloading position, and the components 12 removed, using an automated or manual mechanism, such as a test handler, configured to apply a biasing pressure to the lids 56, and then to remove the components 12.

Figure 10C:
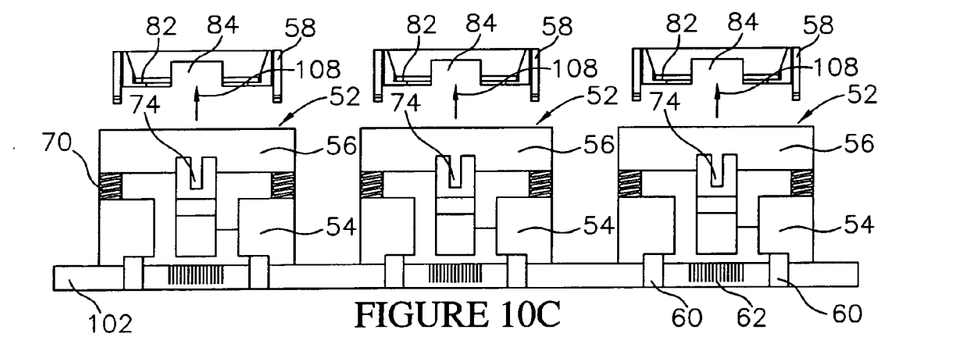

Next, as shown in FIG. 10C, following removal of the components 12, the test sockets 52 can be shifted back to the testing position. In this regard, the springs 70 will automatically shift the test sockets 52 back to the testing position, once the biasing pressure on the lids 56 is removed. As also shown in FIG. 10C, with the test sockets 52 in the testing position, the nests 58 (first nests in the claims) can be removed from the test sockets 52, as indicated by nest removal arrows 108. The nests 58 can be removed from the test sockets 52 using automated or manual tools that are known in the art. Because the test sockets 52 are in the testing position, damage to the socket contacts 68 (FIG. 7C) during removal of the nests 58 is substantially reduced or eliminated. In addition, the configuration of the support surfaces 82 and the cut out openings 84 of the nests 58, allow the nests 58 to be removed without interference or damage to the retention mechanisms 74 (FIG. 6B). Further removal of the nests 58 can be accomplished with the test sockets 52 still mounted to the burn-in board 102.

Figure 10D:
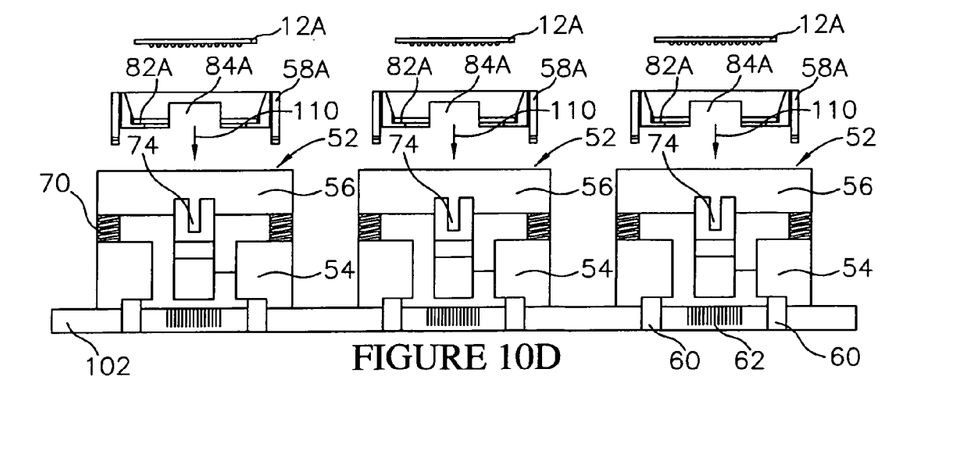

Next, as shown in FIG. 10D, following removal of the nests 58 and with the test sockets 52 still in the testing positions, replacement nests 58A (second nests in the claims) can be installed in the test sockets 52, as indicated by nest installation arrows 110. Installation of the replacement nests 58A can be accomplished with the test sockets 52 still mounted to the burn-in board 102.

With the replacement nests 58A installed in the test sockets 52, the replacement nests 58A can be utilized to align second components 12A in the test sockets 52 having different peripheral outlines than the components 12. With the replacement nests 58A installed in the test sockets 52, the test sockets 52 can be shifted to the loading/unloading positions, and the second components 12A can be loaded into the test sockets 52, substantially as previously described. The second components 12A can then be burn-in tested substantially as previously described.

Thus the invention provides an improved test socket for semiconductor components having a serviceable nest that can be easily removed and replaced in the field with the test socket in a testing position and without damage to the test socket. Also provided are test methods performed using the test socket, and test systems incorporating the test socket. While the invention has been described with reference to certain preferred embodiments, as will be apparent to those skilled in the art, certain changes and modifications can be made without departing from the scope of the invention as defined by the following claims.

What is claimed is:

1. A test socket for a semiconductor component having a plurality of terminal contacts comprising:
   a base comprising a plurality of socket contacts configured to electrically engage the terminal contacts;
   a retention mechanism on the base configured with the test socket in a testing position to retain the component on the base with the socket contacts in electrical engagement with the terminal contacts; and
   a nest on the base configured to align the component in the test socket, the nest comprising a support surface configured to support the component during the electrical engagement and to allow removal and installation of the nest from the base in the testing position without interference from the retention mechanism.

2. The test socket of claim 1 wherein the nest comprises an alignment opening configured to contact a peripheral edge of the component.

3. The test socket of claim 1 wherein the nest comprises an opening for the retention mechanism in the support surface.

4. The test socket of claim 1 further comprising a lid attached to the base and movable to shift the test socket from the testing position to a loading/unloading position.

5. The test socket of claim 1 further comprising a second nest substantially identical to the nest but configured to replace the nest and allow testing of a second component with a different peripheral outline than the component.

6. The test socket of claim 1 further comprising a plurality of pins on the base configured to mount the test socket to a burn-in board.

7. The test socket of claim 1 further comprising a plurality of pin contacts on the base in electrical communication with the socket contacts configured to electrically engage a burn-in board.

8. The test socket of claim 1 wherein the socket contacts and the retention mechanism are configured to allow insertion of the component into the test socket with a zero insertion force on the terminal contacts.

9. A test socket for a semiconductor component movable from a testing position to a loading/unloading position comprising:
   a base comprising a plurality of socket contacts configured to electrically engage the component in the testing position;
   a retention mechanism on the base configured to retain the component on the socket contacts in the testing position; and
   a nest on the base configured to align the component in the test socket, the nest comprising a support surface configured to support the component for electrical engagement in the testing position, and to allow removal and installation of the nest from the base in the testing position without interference or movement of the retention mechanism.

10. The test socket of claim 9 wherein the support surface comprises an opening for the retention mechanism.

11. The test socket of claim 9 further comprising a lid on the base movable to shift the test socket from the testing position to the loading/unloading position.

12. The test socket of claim 9 further comprising a second nest substantially identical to the nest but configured to replace the nest and allow testing of a second component with a different peripheral outline than the component.

13. The test socket of claim 9 further comprising a contact plate on the base comprising a plurality of openings wherein the socket contacts are mounted.

14. The test socket of claim 9 wherein the nest further comprises an alignment opening having a sloped alignment surface configured to engage a peripheral edge of the component.

15. A test socket for a semiconductor component having a plurality of terminal contacts comprising:
   a base comprising a plurality of socket contacts configured to electrically engage the terminal contacts;
   a lid on the base movable to shift the test socket from a testing position for the component to a loading/unloading position for the component;
   a plurality of springs on the base configured to bias the lid to the testing position;
   a retention mechanism on the base configured to retain the component on the base in the testing position and to move in the loading/unloading position to allow insertion or removal of the component from the test socket; and
   a nest on the base comprising an alignment surface for aligning the component, a support surface for supporting the component with the terminal contacts in contact with the socket contacts, the support surface and the alignment surface having openings therein which permit the nest to be removed or installed on the base in the testing position without interference from the retention mechanism.

16. The test socket of claim 15 further comprising a contact plate on the base comprising a plurality of openings wherein the socket contacts are mounted.

17. The test socket of claim 15 wherein the socket contacts are configured with the test socket in the loading/unloading position to allow insertion of the component into the test socket with a zero insertion force on the terminal contacts.

18. The test socket of claim 15 further comprising a second nest substantially identical to the nest but configured to replace the nest and allow testing of a second component with a different peripheral outline than the component.

19. The test socket of claim 15 further comprising a plurality of pin contacts on the base in electrical communication with the socket contacts and configured for electrically engaging a burn-in board.

20. The test socket of claim 15 further comprising a plurality of pins on the base configured for mounting the test socket on a burn-in board.

21. The test socket of claim 15 wherein the alignment surface is formed by an alignment opening having a peripheral outline substantially similar to that of the component.

22. The test socket of claim 15 wherein the alignment surface comprise a picture frame shaped member.

23. A system for testing a semiconductor component having a plurality of terminal contacts comprising:
   a burn-in board; and
   a test socket on the burn-in board movable from a testing position to a loading/unloading position, the test socket comprising a base, a plurality of socket contacts on the base configured to electrically engage the component in the testing position, a retention mechanism on the base configured to retain the component on the socket contacts in the testing position, and a nest on the base configured to align the component in the test socket, the nest comprising a support surface configured to support the component for electrical engagement in the testing position, and to allow removal and installation of the nest from the base in the testing position with the test socket on the burn-in board.

24. The system of claim 23 further comprising a plurality of test sockets on the burn-in board.

25. The system of claim 23 further comprising an oven configured to retain the burn-in board and heat the component.

26. The system of claim 23 further comprising a testing circuitry in electrical communication with the socket contacts.

27. The system of claim 23 further comprising a second nest substantially identical to the nest but configured to replace the nest and allow testing of a second component with a different peripheral outline than the component.

28. The system of claim 23 wherein the socket contacts are configured with the test socket in the loading/unloading position to allow insertion of the component into the test socket with a zero insertion force on the terminal contacts.

29. The system of claim 23 further comprising a plurality of pin contacts on the base in electrical communication with the socket contacts and configured to electrically engage the burn-in board.

30. The system of claim 23 further comprising a plurality of pins on the base configured for mounting the test socket to the burn-in board.

31. A system for testing a semiconductor component having a plurality of terminal contacts comprising:
   a burn-in board;
   a test socket on the burn-in board movable from a testing position to a loading/unloading position, the test socket comprising a base, a plurality of socket contacts on the base configured to electrically engage the terminal contacts, a retention mechanism on the base configured to retain the component with the socket contacts in electrical engagement with the terminal contacts, and a nest on the base configured to align the component in the test socket, the nest comprising a support surface shaped to support the component during the electrical engagement but to allow removal or installation of the nest from the base in the testing position without interference from the retention mechanism; and
   a second nest substantially identical to the nest but configured to replace the nest and allow testing of a second component with a different peripheral outline than the component.

32. The system of claim 31 wherein the test socket comprises a lid on the base movable to shift the test socket from the testing position to the loading/unloading position.

33. The system of claim 31 further comprising a plurality of test sockets on the burn-in board substantially identical to the test socket.

34. The system of claim 31 further comprising a testing circuitry in electrical communication with the burn-in board configured to apply a biasing voltage to the component.

35. The system of claim 31 further comprising an oven configured to retain the burn-in board and heat the component.

* * * * *